United States Patent
Maruyama

[11] Patent Number: 5,438,258
[45] Date of Patent: Aug. 1, 1995

[54] POWER MULTIPLICATION CIRCUIT WHICH REDUCES AN OFFSET VOLTAGE OF A HALL ELEMENT TO ZERO

[75] Inventor: Ryoji Maruyama, Saitama, Japan
[73] Assignee: Kabushiki Kaisha Toshiba, Kawasaki, Japan
[21] Appl. No.: 99,535
[22] Filed: Jul. 30, 1993
[30] Foreign Application Priority Data
 Dec. 11, 1992 [JP] Japan .................. 4-330844
[51] Int. Cl.6 ........................................... G01R 21/00
[52] U.S. Cl. ................. 324/142; 324/117 H; 324/117 R
[58] Field of Search ............... 324/142, 117 R, 117 H, 324/103 R, 251, 252; 307/309; 364/481, 483, 571.01; 338/32 H

[56] References Cited

U.S. PATENT DOCUMENTS

| | | | |
|---|---|---|---|
| 4,525,668 | 6/1985 | Lienhard et al. | 324/117 R |
| 4,608,533 | 8/1986 | Starkie | 324/142 |
| 4,808,918 | 2/1989 | Rozman | 324/142 |
| 4,853,620 | 8/1989 | Halder et al. | 324/142 |
| 4,972,141 | 11/1990 | Rozman et al. | 324/142 |

FOREIGN PATENT DOCUMENTS

| | | |
|---|---|---|
| 2594230 | 8/1987 | France . |
| 3235188 | 3/1984 | Germany . |
| 3723268 | 1/1988 | Germany . |
| 2107070 | 4/1983 | United Kingdom . |
| 2199411 | 7/1988 | United Kingdom . |

OTHER PUBLICATIONS

Patent Abstracts of Japan, vol. 7, No. 113 (P-197), May 18, 1983, JP-A-58034365, Feb. 28, 1983.

*Primary Examiner*—Vinh Nguyen
*Attorney, Agent, or Firm*—Oblon, Spivak, McClelland, Maier & Neustadt

[57] ABSTRACT

A power multiplication circuit including a Hall element for generating between voltage output terminals thereof a first output voltage corresponding to a power of a system under measurement. The circuit further includes a voltage polarity detection circuit for detecting a polarity of a power source voltage of the system and an operating circuit connected to receive the first output voltage and the polarity for amplifying the first output voltage and for changing over between amplified first output voltage and an inverted voltage of the amplified first output voltage to generate a second output voltage in accordance with the polarity. The circuit also includes an integrating amplifier circuit for integrating the second output voltage to generate an integrated signal and a variable resistance element connected between one of the voltage output terminals of the Hall element and ground, and connected to receive the integrated signal. The resistance thereof is changed by the integrated signal so that an offset voltage of the Hall element is reduced to zero.

11 Claims, 6 Drawing Sheets

| MAGNETIC FIELD INTENSITY [CURRENT FLOW DIRECTION BETWEEN $I_S - I_L$] | POSITIVE ∩ | POSITIVE ∩ | NEGATIVE ∪ | NEGATIVE ∪ |
|---|---|---|---|---|
| POWER SOURCE VOLTAGE [POTENTIAL DIFFERENCE BETWEEN $P_1 - P_2$] | POSITIVE ∩ | NEGATIVE ∪ | POSITIVE ∩ | NEGATIVE ∪ |
| OUTPUT VOLTAGE [POTENTIAL DIFFERENCE BETWEEN $T_3 - T_4$] | ∩ | ∪ | ∪ | ∩ |
| DIRECTION OF OFFSET | POSITIVE | NEGATIVE | POSITIVE | NEGATIVE |

Fig.7

POWER MULTIPLICATION CIRCUIT WHICH REDUCES AN OFFSET VOLTAGE OF A HALL ELEMENT TO ZERO

BACKGROUND OF THE INVENTION

1. Field of the Invention

This invention relates to a power multiplication circuit using a Hall element, and more particularly to a power multiplication circuit used in, such as a power meter or a watt hour meter, wherein the offset compensation means of the Hall element is improved.

2. Detailed Description of the Related Art

In general, power multiplication circuits of this type are widely used as power multiplication circuits of power meters and/or watt hour meters on account of their uncomplicated construction and small size. Such a conventional power multiplication circuit will now be described with reference to FIG. 4. The power source voltage of a system under measurement is input at input terminals P1, P2, passes through a voltage conversion circuit 1 comprising a voltage divider circuit with resistors RA and RB, and is input to a voltage-current conversion circuit 2. Voltage-current conversion circuit 2 outputs a current proportional to the input voltage to control current terminal T1 of Hall element 3. Meanwhile, the current from the system under measurement is input to terminals 1S, 1L of current coil 105 would on magnetic material core 104 shown in FIG. 5, so that a magnetic field proportional to the input current is generated in gap 106. As a result, a Hall electromotive force Ey given by expression (1) is generated at voltage output terminals T3, T4 of Hall element 3, which is positioned so as to be at right angles to the magnetic field of gap 106 and to the direction of flow of the control current of Hall element 3 which is from terminal T1 to terminal T2.

$$Ey = Rh \cdot Bz \cdot Jx \quad (1)$$

where Rh is the Hall coefficient, Bz is the magnetic field intensity, and Jx is the current density. In FIG. 4, the direction of the magnetic field is shown as an arrow x. Variable resistor VR1 is connected between voltage output terminals T3, T4 and serves to compensate for the offset voltage generated by the asymmetry of the characteristic of Hall element 3. Its moving contact is connected to ground together with control current terminal T2. Output terminals OUT1 and OUT2 of the power multiplication circuit are connected to voltage output terminals T3 and T4, respectively.

Next, the mechanism of offset voltage generation will be described with reference to the internal equivalent circuit of Hall element 3 shown in FIG. 6. The equivalent circuit is expressed by a resistance bridge circuit, as shown. The output voltage is given by expression (2), if the respective voltages at the nodes are taken as E1, E2, E3, and E4 when the voltage E0 is applied to terminal T1 and the bridge resistances are respectively R1, R2, R3 and R4.

$$E3-E4 = \frac{R2}{R1+R2}(E1-E2) - \frac{R4}{R3+R4}(E1-E2) \quad (2)$$
$$= \frac{R2 \cdot R3 - R1 \cdot R4}{(R1+R2)(R3+R4)}(E1-E2)$$

If the magnetic field is 0, $$R1/R2 = R3/R4 \quad (3)$$

So, $E3-E4=0$.

Though, in the above expressions (2) and (3), the voltage E0 and resistances R5, T6, R7 and R8 are not expressed positively, they are included in the voltages E1, E2, E3 and E4. And when Hall element 3 is connected to a following circuit having a very high input impedance, the output voltage between terminals T3 and T4 of Hall element is nearly equal to the voltage (E3−E4) expressed in the expression (2).

However, if for example resistance R1 fluctuates in the direction such that it is decreased by an amount r1, $$E3-E4 = \frac{R2 \cdot R3 - (R1-r1)R4}{(R1-r1+R2)(R3+R4)}(E1-E2) \neq 0 \quad (4)$$

So, an offset voltage is generated between terminals T3 and T4 by the residual voltage even if the magnetic field is 0.

Next, the effect of the offset voltage when a magnetic field is present will be described. We assume that a magnetic field as shown in the Figure is applied to Hall element 3 of FIG. 6, and that the resistances of resistors R1, R4 decrease while the resistances of resistors R2, R3 increase. The result of expressing graphically the potential difference between output voltage terminals T3, T4 is shown in FIG. 7 when a half-wave AC current flows between terminals T1, T2 for the four combinations of "positive"/"negative" direction of the magnetic field and "0 degrees/"180 degrees" of the phase of the control current. The upper row of diagrams in FIG. 7 indicates the waveform of the magnetic field intensity. The middle row indicates the waveform of the power source voltage of the system under measurement. The lower row indicates the waveform of the output voltage which is shown by broken lines in the case where there is no offset. If now we assume that the offset of resistor R1 is generated in the direction of decreasing resistance, the output voltage is decreased or increased by the amount of the offset voltage, as shown by the continuous line in the bottom row of FIG. 7. Accordingly, the output voltage is adjusted to zero in the condition where magnetic field is not applied by providing a variable resistor VR1 as shown in FIG. 4 to cancel the deviation of the output voltage produced by this offset voltage.

In the conventional power multiplication circuit described above, adjustment of the variable resistance in order to compensate the offset for fluctuations in the offset resistance produced by temperature change or occurring over a period of years was indispensable. However, for watt hour meters used by ordinary users this type of continuous adjustment operation is impracticable and occurrence of errors was therefore inevitable. Due to the need for a component having a mechanical contact part such as a variable resistor, there was also a reliability problem, and the power multiplication circuit was difficult to implement as an LSI.

SUMMARY OF THE INVENTION

Accordingly, one object of this invention is to provide a power multiplication circuit wherein fluctuation in the offset voltage due to temperature change or change over a period of years etc. can be automatically corrected.

These and other objects of this invention can be achieved by providing a power multiplication circuit including a Hall element for generating between voltage output terminals thereof a first output voltage corresponding to a power of a system under measurement. The circuit further includes a voltage polarity detection circuit for detecting a polarity of a power source voltage of the system and an operating circuit connected to receive the first output voltage and the polarity for amplifying the first output voltage and for changing over between amplified first output voltage and an inverted voltage of the amplified first output voltage to generate a second output voltage in accordance with the polarity. The circuit also includes an integrating amplifier circuit for integrating the second output voltage to generate an integrated signal and a variable resistance element connected between one of the voltage output terminals of the Hall element and ground, and connected to receive the integrated signal. The resistance thereof is changed by the integrated signal so that an offset voltage of the Hall element is reduced to zero.

According to another aspect of this invention, there is further provided a power meter for detecting a power of a system. The power meter includes a voltage-current conversion circuit connected to receive a power source voltage of the system under measurement for converting the power source voltage to a control current proportional to the power source voltage and a Hall element. The Hall element is provided with control current input terminals and voltage output terminals and is positioned in a magnetic field such that a plane thereof created by the control current input terminals and the voltage output terminals is substantially perpendicular to the magnetic field. An intensity of the magnetic field is proportional to a current of the system under measurement. The Hall element is connected to the voltage-current conversion circuit such that the control current flows through the control current input terminals and generates a first output voltage corresponding to the power of said system under measurement between the voltage output terminals. The power meter further includes a voltage polarity detection circuit for detecting a polarity of the power source voltage of the system under measurement and an operating amplifier circuit connected to receive the first output voltage and for amplifying the first output voltage to generate amplified first output voltage and an inverted voltage of the amplified first output voltage. An output terminal of the power meter is connected to the operating amplifier circuit for outputting the amplified first output voltage as the power of the system under measurement. The power meter also includes a switch circuit connected to receive the amplified first output voltage, the inverted voltage and the polarity for changing over the amplified first output voltage and the inverted voltage to generate a second output voltage in accordance with the polarity and an integrating amplifier for integrating the second output voltage to generate an integrated signal. The power meter further includes a variable resistance element connected between one of the voltage output terminals of the Hall element and ground and connected to receive the integrated signal. A resistance thereof is changed by the integrated signal so that an offset voltage of the Hall element is reduced to zero.

In this invention, by adopting the above means, the integrated value of the offset voltage is increased or decreased, with directionality, by arranging for the input to the integration circuit to be changed over in response to the polarity of the power source voltage of the system under measurement. The resistance of the variable resistor is thereby increased on decreased in response to the magnitude of the integrated value that is output by the integration circuit. This enables fluctuation of the offset resistance to be compensated such that the power can be calculated without offset.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is a diagram given in explanation of the relationship between the Hall electromotive force and offset voltage.

DETAILED DESCRIPTION OF THE PREFERRED EMBODIMENTS

Figure 1:
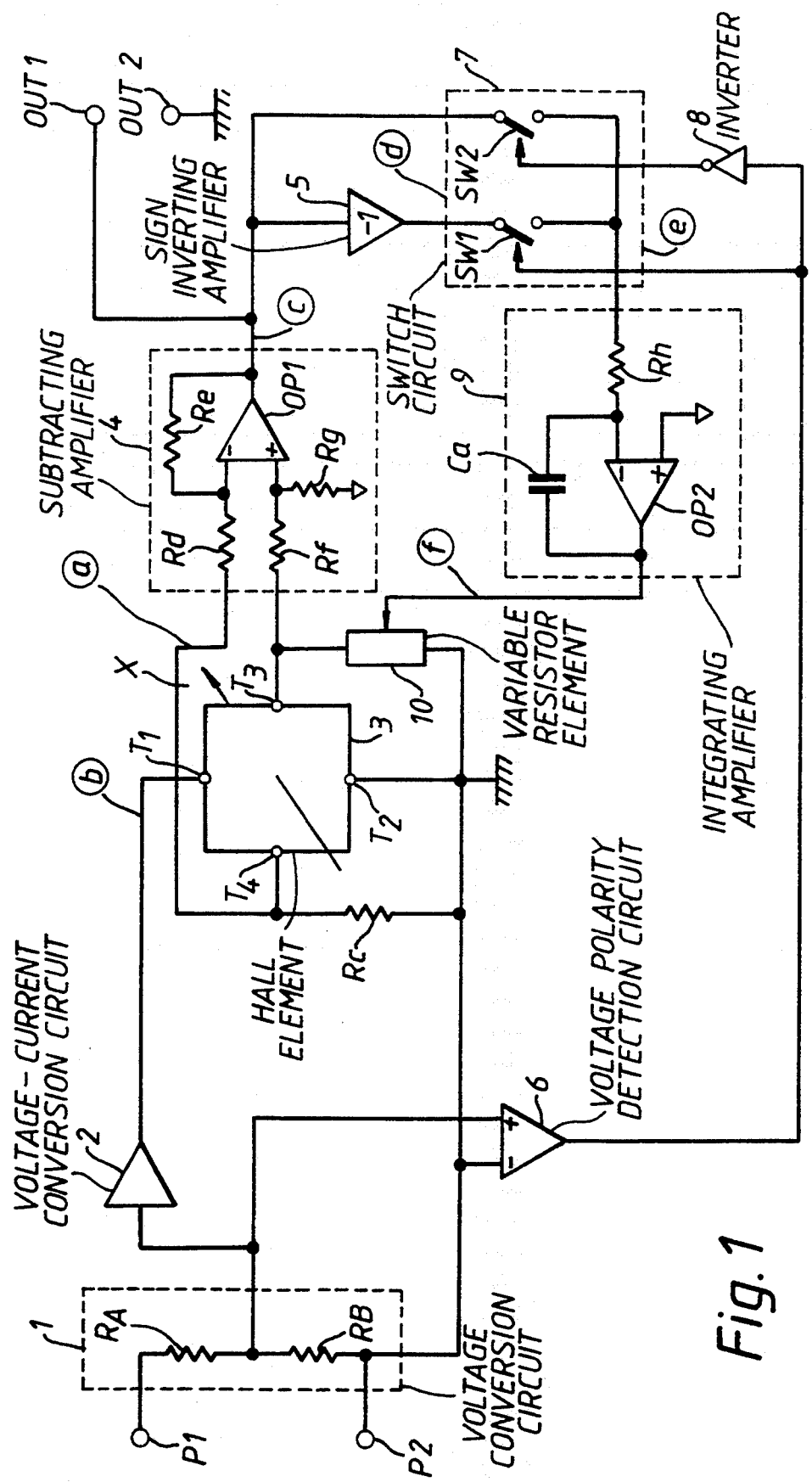
FIG. 1 is a circuit diagram of a power multiplication circuit according to an embodiment of this invention.

Referring now to the drawings, wherein like reference numerals designate identical or corresponding parts throughout the several views, the embodiments of this invention will be described below.

Figure 5:
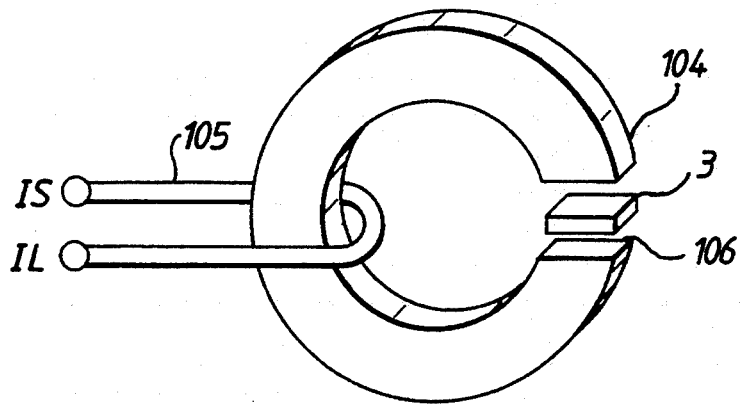
FIG. 5 is a layout diagram of a magnetic field generating unit.
Figure 6:
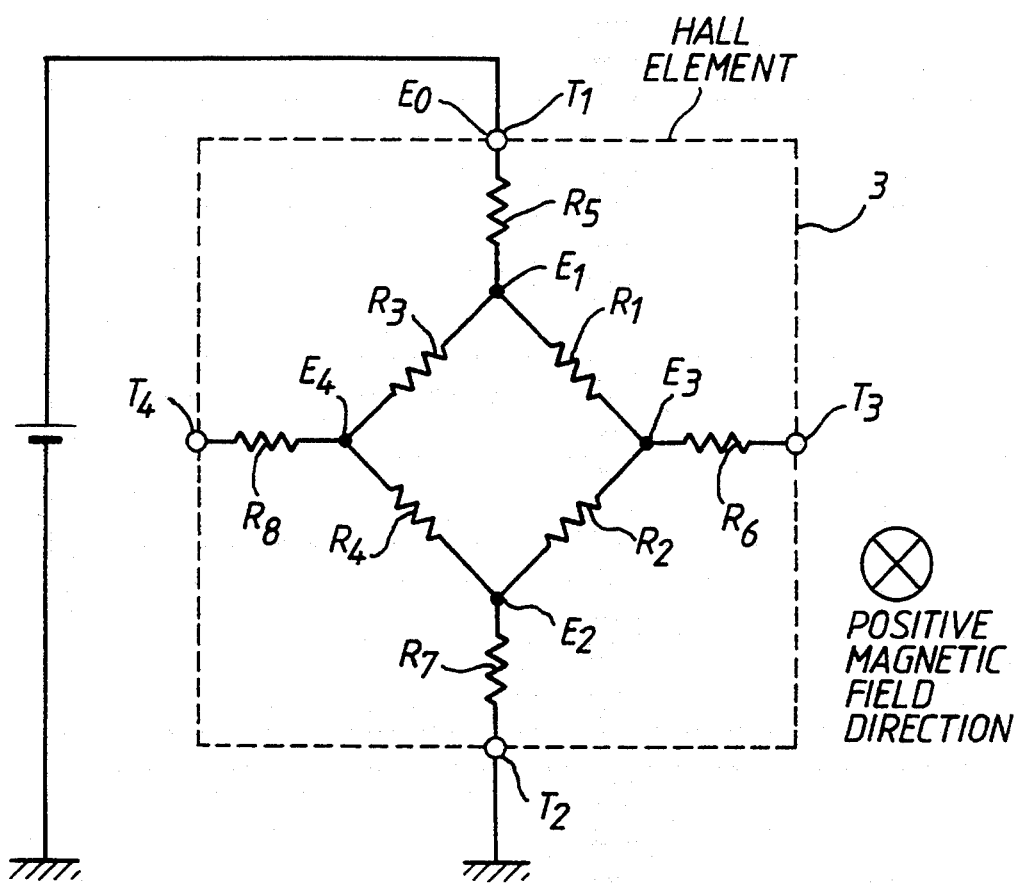
FIG. 6 is an equivalent circuit diagram of a Hall element.

FIG. 1 is a circuit diagram of a power multiplication circuit according to an embodiment of this invention. In FIG. 1, P1 and P2 are power source voltage input terminals that input the power source voltage, such as a.c. 100 volts of the system under measurement. 1 is a voltage conversion circuit for converting the power source voltage input to input terminals P1 and P2 to a voltage suitable for matching the voltage in the power multiplication circuit by stepping up or stepping down. This voltage conversion circuit 1 can be constituted using a voltage division circuit based on resistors RA, RB as shown in FIG. 1, or a transformer etc. 2 is a voltage-current conversion circuit that outputs a current proportional to the output voltage of voltage conversion circuit 1 at output terminal 1a. 3 is a Hall element, which is provided with control current input terminals T1, T2 that input the current output from voltage-current conversion circuit 2, and with voltage output terminals T3, T4 that output the voltage obtained by the Hall effect. The construction is such that Hall element 3 is held in gap 106 of magnetic material core 104 around which current coil 105 is wound as shown in FIG. 5, and the plane created by control current input terminals T1, T2 and voltage output terminals T3, T4 is perpendicular to the magnetic field generated in the gap 106. The direction of the magnetic field is shown as an arrow x in FIG. 1. 4 is a subtracting amplifier that receives the AC voltages that are output at voltage output terminals T3, T4 of Hall element 3, and outputs the difference of the AC voltage to output terminal OUT1 of the power multification circuit. Output terminal OUT2 thereof is connected to ground. 5 is a sign inverting amplifier that inverts the polarity of the voltage applied from subtracting amplifier 4. 6 is a voltage polarity detection circuit connected between input terminal P2 and output terminal 1a of voltage conversion circuit 1 that ascertains the polarity of the power source voltage of the system that is the subject of measurement.

The output of voltage polarity detection circuit 6 is used such that if the ascertained polarity is positive a switch SW1 is closed and a switch SW2 is opened through an inverter 8, and if the ascertained polarity is negative switch SW1 is opened and switch SW2 is closed through inverter 8.

Switches SW1 and SW2 in a switch circuit 7 are respectively switches that are put in the closed condition by an input signal of level "1" and put in the open condition by an input signal of level "0". The primary side of switch SW1 is connected to the output of sign inverting amplifier 5, while the primary side of switch SW2 is connected to the output of subtracting amplifier 4. 9 is an integrating amplifier that integrates the voltage output from the secondary side of switches SW1, SW2. 10 is a variable resistance element connected between ground and voltage output terminal T3, so that its resistance value is controlled by the output of integrating amplifier 9. It may be implemented using an FET or Cds photocoupler etc. Rc is a resistor connected between voltage output terminal T4 and ground and is provided to take account of the case where the offset resistance r1 is negative.

Subtracting amplifier 4 is constructed, for example, by an operational amplifier OP1 and resistors Rd, Re, Rf and Rg. Integrating amplifier 9 is constructed, for example, by an operational amplifier OP2, a resistor Rh and a capacitor Ca.

Next, the operation of the circuit constructed as above will be described. The power source voltage of the system under measurement that is input to power source voltage input terminals P1, P2 is converted to the suitable voltage by voltage conversion circuit 1, which is input to voltage-current conversion circuit 2. The current obtained by converting the input voltage to a current proportional to it in voltage-current conversion circuit 2 flows into Hall element 3 from the control current input terminal T1 to terminal T2 of Hall element 3. Meanwhile, the current of the system under measurement is made to flow to current coil 105 of magnetic material core 104, producing a magnetic field in gap 106 the intensity of which is proportional to the current of the system under measurement. This therefore results in the generation of a Hall electromotive force given by expression (1) at voltage output terminals T3, T4 of Hall element 3. The output voltage difference across voltage output terminals T3, T4 is therefore proportional to the product of the voltage and the current of the system under measurement. In other words, it is proportional to the power of the system under measurement. Subtracting amplifier 4 differentially amplifies its two inputs from voltage output terminals T3, T4 so that the output voltage difference across these voltage output terminals T3, T4 is output to the outside from output terminals OUT1 and OUT2 as the power value of the system under measurement. The polarity of the power source voltage of the system under measurement, which has been subjected to voltage conversion in voltage conversion circuit 1, is ascertained by voltage polarity detection circuit 6. The ascertained polarity is used by switch circuit 7 to change over the phase of the output voltage of subtracting amplifier 4 which is input to integrating amplifier 9. The operation is such that, for example, if the polarity of the power source voltage of the system under measurement is positive, switch SW1 is closed and switch SW2 is opened, so that an output voltage of sign inverting amplifier 5 in which the polarity of output voltage of subtracting amplifier 4 is inverted is input to integrating amplifier 9. In the opposite situation, if the polarity of the power source voltage of the system under measurement is negative, switch SW1 is opened and switch SW2 is closed, with the result that the output voltage of subtracting amplifier 4 is directly input to integrating amplifier 9 without inversion of polarity. Integrating amplifier 9 integrates the output voltage of switch circuit 7 and outputs the result to variable resistance element 10. Variable resistance element 10 changes its resistance in the direction such as to compensate for the offset voltage, this change being made in accordance with the sign and the magnitude of the input voltage.

Figure 2:
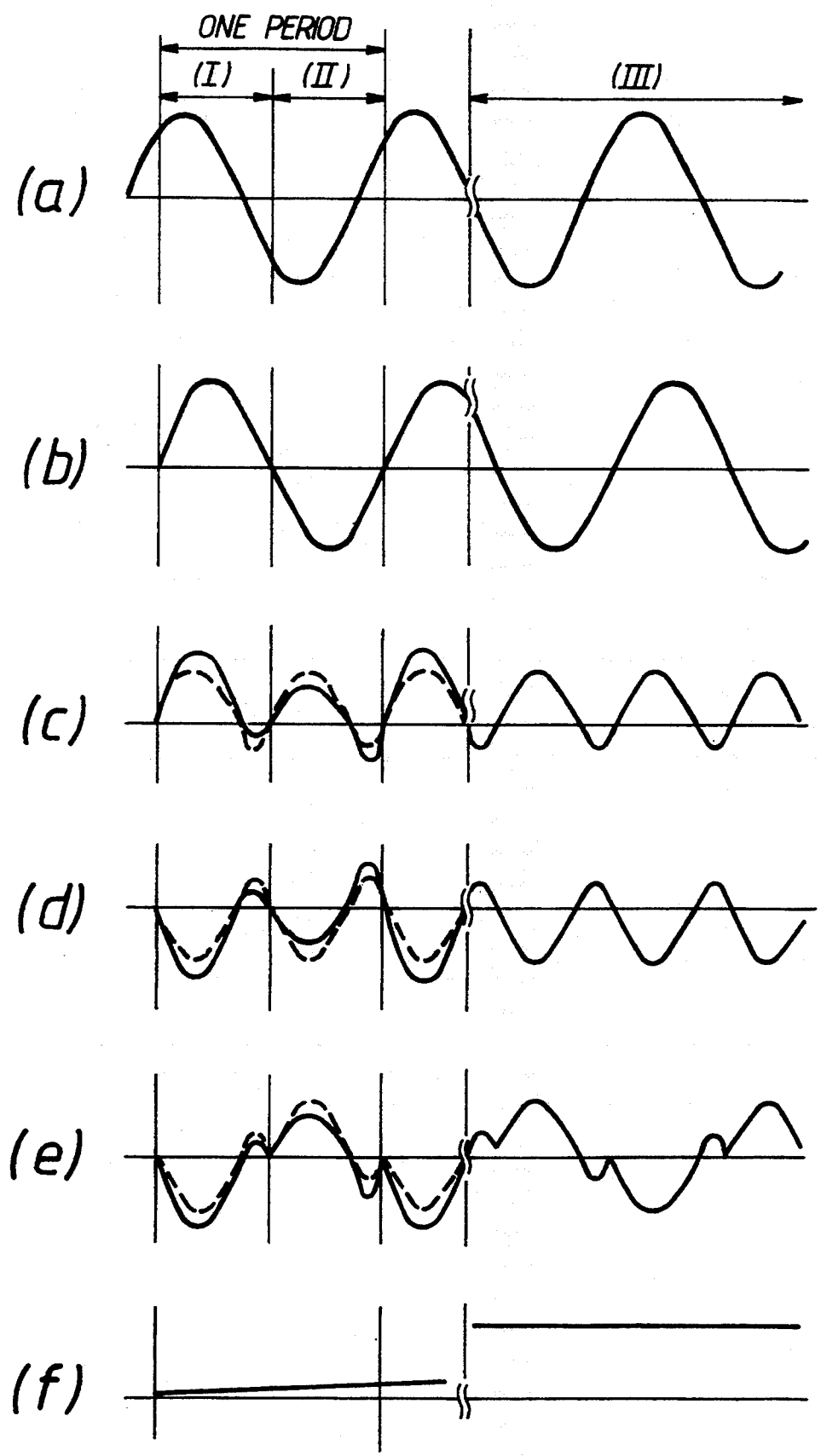
FIG. 2 is a waveform diagram of the various sub-units of the power multiplication circuit shown in FIG. 1.

Next, typical waveforms at various locations of the power multiplication circuit on input of a sign wave will be described with reference to FIG. 2. (a) shows the magnetic field intensity in. gap 106 of magnetic material core 104. (b) shows the current waveform of the output from voltage-current conversion circuit 2 that is input to Hall element 3. (c) shows the waveform of the output of subtracting amplifier 4. In (c), (d) and (e) of FIG. 2, the waveform when there is no offset is shown by a broken line, while the waveform when offset is present is shown by a continuous line. All of these waveforms are generated in accordance with the rules of combination of direction of magnetic field and polarity of the current shown in FIG. 7. (d) is the output waveform of sign inverting amplifier 5 and is arrived at by inverting the waveform of (c). (e) is the waveform of the output of switch circuit 7 obtained by operating switch circuit 7 by means of voltage polarity detection circuit 6 in response to the power source voltage of the system under measurement; it is also the waveform of the input to integrating amplifier 9. During the period indicated by (I) in the Figure, the output voltage of sign inverting amplifier 5 shown in (d) is input to integrating amplifier 9 by the closure of switch SW1. Also, in the period indicated by (II) in the Figure, the output voltage of subtracting amplifier 4 shown in (c) is input to integrating amplifier 9 by the closure of switch SW2. When there is no offset, the waveform expressed by a broken line in (e) in period (I) has the opposite polarity but equal magnitude to the waveform expressed by a broken line in (e) in period (II), so the output of integrating amplifier 9 is zero when integrated over one period including the period (I) and the period (II). When the offset resistance r1 (r1>0) is present in Hall element 3, since the waveform, shown by the continuous line in (e), is offset in the negative direction, the output integrated by integrating amplifier 9, as shown in (f), is not zero.

Variable resistance element 10 is controlled based on the output of the integrating amplifier 9 as follows.

The resistance of variable resistance element 10 decreases as the output voltage of integrating amplifier 9 increases, until it reaches a resistance that compensates the offset resistance r1 of Hall element 3. The input voltage waveform of integrating amplifier 9 then has a waveform as shown by the broken line in (e). The output of integrating amplifier 9, does not further change, and the resistance of variable resistance element 10 is then maintained unaltered in this condition, in the state of period (III). Resistor Rc is required to effect compensation in the case where offset resistance r1 is negative.

With the embodiment described above, the offset voltage generated by change in the characteristic of Hall element 3 can be automatically corrected, so that the power can be calculated accurately.

Figure 3:
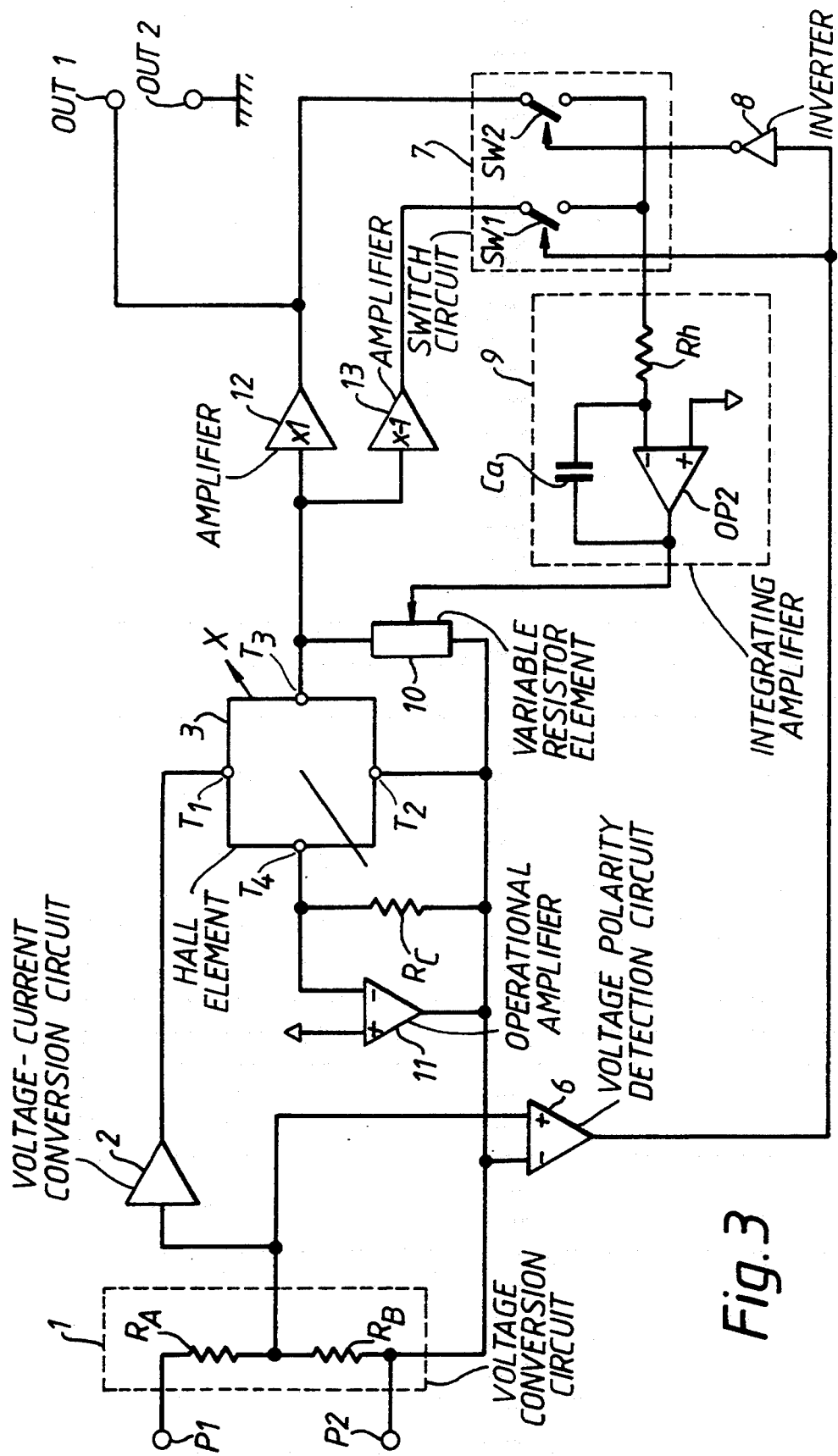
FIG. 3 is a circuit diagram of a power multiplication circuit according to another embodiment of this invention.
Figure 4:
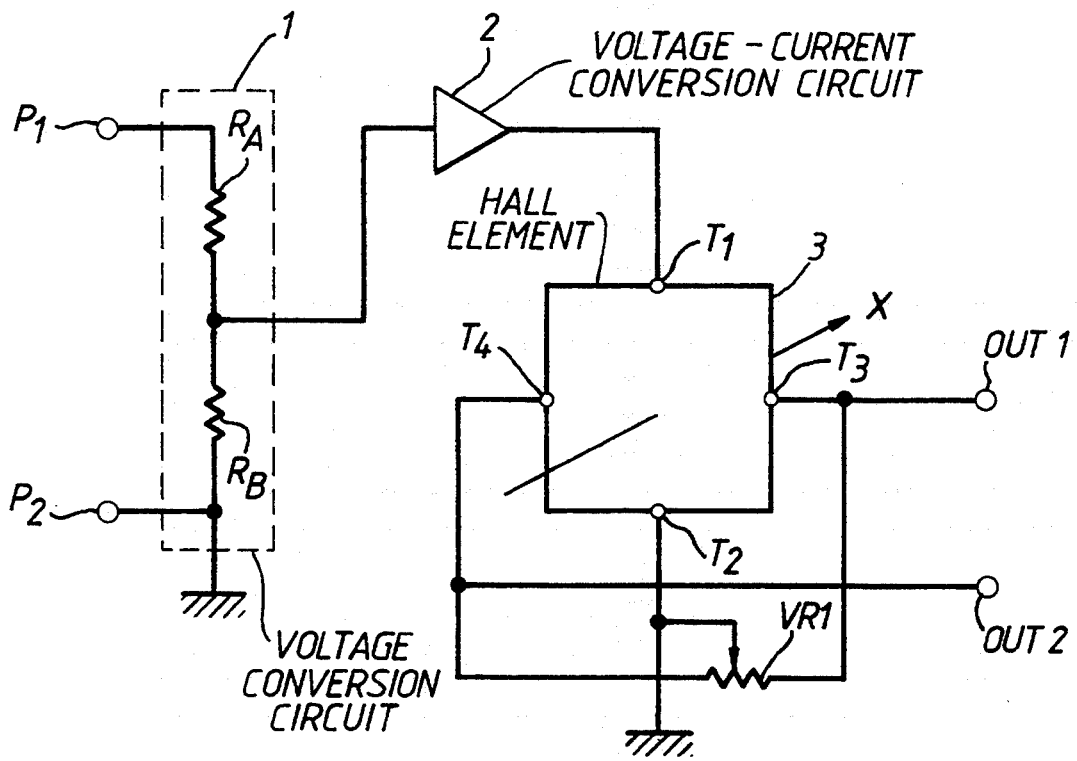
FIG. 4 is a circuit diagram of a conventional power multiplication circuit.

FIG. 3 is a circuit diagram showing a power multiplication circuit according to another embodiment of this invention. The same benefits as in the first embodiment can be obtained by employing two amplifiers 12, 13 differing in phase by 180 degrees but of mutually equal gain in place of subtracting amplifier 4, by connecting operational amplifier 11 to voltage output terminal T4 of Hall element 3, and holding voltage output terminal T4 at ground level.

In the embodiments shown in FIG. 1 and FIG. 3, inverter 8 is used for controlling switch SW2. But this invention is not limited to these embodiments. In the case that switch SW2 is used a switch that is put in the open condition by an input signal of level "1" and put in the closed condition by an input signal of level "0", inverter 8 can be omitted and switch SW2 is controlled directly by the output of voltage polarity detection circuit 6. Also, in FIG. 1 and FIG. 3, switch circuit 7 maybe a circuit having a mechanical contact, or a contact-less switch, such as a semiconductor switch.

As described above, with this invention, a power multiplication circuit can be provided which is of high accuracy and wherein fluctuations of the offset voltage produced by temperature change and change over a period of years can be automatically corrected.

Furthermore, since mechanical parts are eliminated, it can easily be implemented as an LSI, enabling high reliability to be attained. Additionally, operation is simplified in that there is no need for initial adjustment.

Obviously, numerous modifications and variations of the present invention are possible in light of the above teachings. It is therefore to be understood that within the scope of the appended claims, the invention may be practiced otherwise than as specifically described herein.

What is claimed is:

1. A power multiplication circuit, comprising:
   a Hall element member, disposed in a magnetic field having a strength which is proportional to an amount of current being used by a system under measurement and having an input for inputting a signal which is proportional to a voltage being used by the system under measurement, for generating a first voltage between voltage output terminals thereof, said first voltage corresponding to an amount of power being used by the system under measurement;
   voltage polarity detection means for detecting a polarity of a power source voltage of said system under measurement and having an output for outputting said polarity of the power source voltage;
   operating means, connected to said first voltage and said output of said voltage polarity detection means, for amplifying said first voltage and having an output for outputting one of an amplified first voltage and said amplified first voltage with an inverted polarity as a second voltage on an output of the operating means, in accordance with said polarity of the power source voltage output by said voltage polarity detection means;
   integrating amplifier means, connected to the output of the operating means, for integrating said second output voltage and generating an integrated signal; and
   a variable resistance member, connected between one of said voltage output terminals of said Hall element member and ground and connected to said integrated signal, for changing a resistance thereof in accordance with said integrated signal.

2. The power multiplication circuit according to claim 1, wherein said operating means includes:
   subtracting amplifier means, connected to said Hall element member, for detecting a difference between voltages at said voltage output terminals of said Hall element member and for amplifying said difference to generate said amplified first voltage at an output thereof;
   inverting amplifier means, connected to the output of said subtracting amplifier means, for inverting said amplified first voltage to generate said amplified first voltage with an inverted polarity;
   switch means, connected to receive said amplified first voltage, said amplified first voltage with an inverted polarity and said polarity of the power source voltage, having an output which is switched between one of said amplified first voltage and said amplified first voltage with an inverted polarity as said second output voltage in accordance with said polarity of the power source voltage.

3. The power multiplication circuit according to claim 2:
   wherein said switch means includes,
   a first switch having a first terminal and a second terminal, said first terminal being connected to an output terminal of said inverting amplifier means, said second terminal being connected to an input terminal of said integrating amplifier means,
   a second switch having a third terminal and a fourth terminal, said third terminal being connected to an output terminal of said subtracting amplifier means, said fourth terminal being connected to said input terminal of said integrating amplifier means, and
   inverter means for inverting said polarity of said power source voltage; and
   wherein when said polarity of the power source voltage is positive, said first switch is closed and said second switch is opened via said inverter means and said switch means outputs said first voltage with an inverted polarity as said second voltage, and when said polarity of the power source voltage is negative, said first switch is opened and said second switch is closed via said inverter means and said switch means outputs said amplified first voltage as said second voltage.

4. The power multiplication circuit according to claim 3, wherein each of said first and second switches includes a mechanical switch.

5. The power multiplication circuit according to claim 3, wherein each of said first and second switches includes a semiconductor switch.

6. The power multiplication circuit according to claim 1:
   wherein said operating means includes,
   first amplifier means, connected to a first voltage output terminal of said Hall element member, for amplifying said first voltage to generate said amplified first voltage, second amplifier means, connected to said first voltage output terminal of said Hall element member, for amplifying and inverting said first voltage to generate said amplified first voltage with an inverted polarity, and switch means, connected to receive said amplified first voltage, said amplified first voltage with an inverted polarity and said polarity of the power source voltage, having an output which is switched between said amplified first voltage and said amplified first voltage with an inverted polarity to generate said second voltage in accordance with said polarity of the power source voltage.

7. The power multiplication circuit according to claim 6:

wherein said switch means includes, a first switch having a first terminal and a second terminal, said first terminal being connected to an output terminal of said second amplifier means, said second terminal being connected to an input terminal of said integrating amplifier means, a second switch having a third terminal and a fourth terminal, said third terminal being connected to an output terminal of said first amplifier means, said fourth terminal being connected to said input terminal of said integrating amplifier means, and inverter means for inverting said polarity of said power source voltage; and wherein when said polarity of the power source voltage is positive, said first switch is closed and said second switch is opened via said inverter means and said switch means outputs said amplified first voltage with an inverted polarity as said second voltage, and when said polarity of the power source voltage is negative, said first switch is opened and said second switch is closed via said inverter means and said switch means outputs said amplified first voltage as said second voltage.

8. The power multiplication circuit according to claim 7, wherein each of said first and second switches includes a mechanical switch.

9. The power multiplication circuit according to claim 7, wherein each of said first and second switches includes a semiconductor switch.

10. A power multiplication circuit according to claim 1, wherein:

the Hall element member produces an offset voltage across said voltage output terminals; and wherein said variable resistance member, said integrating amplifier means, said operating means, and said voltage polarity detection means operate to reduce said offset voltage of said Hall element member to zero.

11. A power meter for detecting a power of a system, comprising:

a voltage-current conversion circuit connected to receive a power source voltage of said system under measurement for converting said power source voltage to a control current proportional to said power source voltage;

a Hall element having control current input terminals and voltage output terminals, positioned in a magnetic field such that a plane thereof created by said control current input terminals and said voltage output terminals is substantially perpendicular to said magnetic field;

an intensity of said magnetic field being proportional to a current of said system under measurement;

said Hall element being connected to said voltage-current conversion circuit such that said control current flows through said control current input terminals and generating a first output voltage corresponding to said power of said system under measurement between said voltage output terminals;

voltage polarity detection circuit for detecting a polarity of said power source voltage of said system under measurement;

an operating amplifier circuit connected to receive said first output voltage and generate for generating an amplified first output voltage and an inverted voltage which is equal to an inverted voltage of said amplified first output voltage;

an output terminal connected to said operating amplifier circuit for outputting said amplified first output voltage as said power of said system under measurement;

a switch circuit connected to receive said amplified first output voltage, said inverted voltage and said polarity for changing over said amplified first output voltage and said inverted voltage to generate a second output voltage in accordance with said polarity;

an integrating amplifier for integrating said second output voltage to generate an integrated signal; and a variable resistance element connected between one of said voltage output terminals of said Hall element and ground, and connected to receive said integrated signal, a resistance thereof being changed by said integrated signal;

whereby an offset voltage of said Hall element being reduced to zero.

* * * * *